United States Patent
Godot et al.

(10) Patent No.: US 8,898,930 B2
(45) Date of Patent: Dec. 2, 2014

(54) METHOD FOR TREATING A TRANSPORT SUPPORT FOR THE CONVEYANCE AND ATMOSPHERIC STORAGE OF SEMICONDUCTOR SUBSTRATES, AND TREATMENT STATION FOR THE IMPLEMENTATION OF SUCH A METHOD

(75) Inventors: Erwan Godot, Annecy (FR); Remi Thollot, Saint Christo en Jarez (FR); Amaud Favre, Annecy (FR)

(73) Assignee: Alcatel Lucent, Paris (FR)

( * ) Notice: Subject to any disclaimer, the term of this patent is extended or adjusted under 35 U.S.C. 154(b) by 625 days.

(21) Appl. No.: 12/733,081

(22) PCT Filed: Aug. 11, 2008

(86) PCT No.: PCT/EP2008/060548
§ 371 (c)(1),
(2), (4) Date: Jun. 24, 2010

(87) PCT Pub. No.: WO2009/021941
PCT Pub. Date: Feb. 19, 2009

(65) Prior Publication Data
US 2010/0282272 A1    Nov. 11, 2010

(30) Foreign Application Priority Data

Aug. 13, 2007  (FR) ..................... 07 57049

(51) Int. Cl.
*B08B 7/00*   (2006.01)
*F26B 5/04*   (2006.01)
(Continued)

(52) U.S. Cl.
CPC . *F26B 5/04* (2013.01); *F26B 5/048* (2013.01); *F26B 25/225* (2013.01);
(Continued)

(58) Field of Classification Search
CPC ............ F26B 5/04; F26B 5/048; F26B 11/00; H01L 21/67017; H01L 21/67769; H01L 21/6735; H01L 21/67034; H01L 21/67028; H01L 21/67389
USPC ....................... 134/2, 21, 11, 31; 250/455.11; 422/22–23; 34/266, 403, 269, 559, 427
See application file for complete search history.

(56) References Cited

U.S. PATENT DOCUMENTS 3,006,077 A * 10/1961 Goebel et al. ................... 34/553
4,977,688 A * 12/1990 Roberson et al. ............... 134/21
(Continued)

FOREIGN PATENT DOCUMENTS

| DE | 889426 | 9/1953 |
|----|--------|--------|
| DE | 3111223 | 10/1982 |

(Continued)

OTHER PUBLICATIONS

Mashkov, P., et al., "Emission Spectra Control for Infrared Heaters by Electronic Pulse Management" 26th International Spring Seminar on Electronics Technology (2003).*

Primary Examiner — Jack Berman
Assistant Examiner — Wyatt Stoffa
(74) Attorney, Agent, or Firm — Carmen Patti Law Group, LLC

(57) ABSTRACT

The aim of the invention is to provide a method for the treatment of a transport support (1) for the conveyance and storage of semiconductor substrates, with said support (1) possibly having first undergone a cleaning operation using a liquid. The method includes a treatment stage in which the transport support (1) is placed in a sealed chamber (4) connected to a vacuum pump (5) and said transport support (1) is subjected to the combined action of a subatmospheric pressure and infrared radiation to favor the removal of foreign bodies on the walls of the transport support (1).
The invention also concerns a treatment station for a transport support (1) for implementation of the method.

18 Claims, 7 Drawing Sheets

Figure 1:
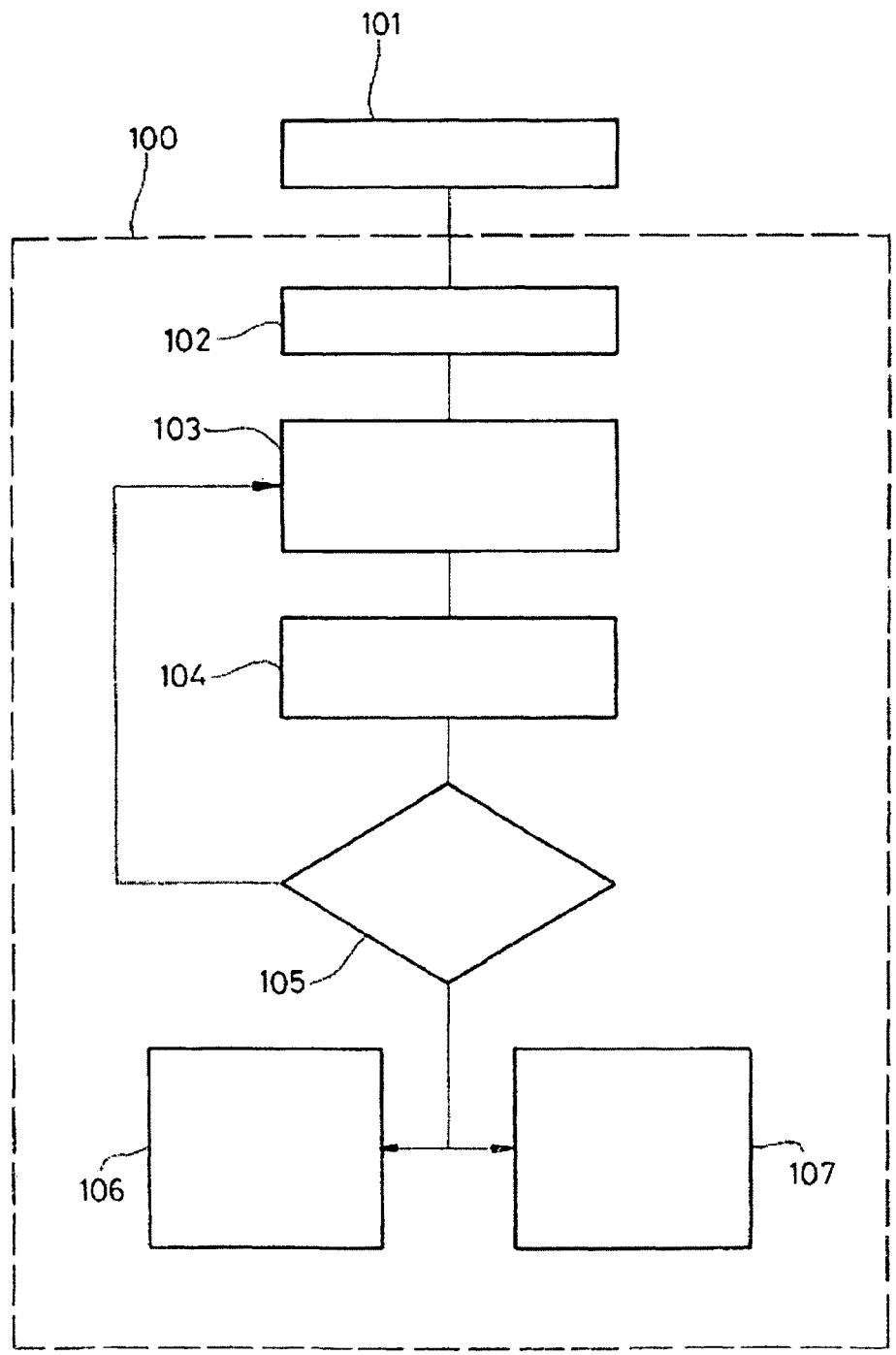

(51) Int. Cl.

| | |
|---|---|
| *F26B 25/22* | (2006.01) |
| *H01L 21/67* | (2006.01) |
| *H01L 21/673* | (2006.01) |
| *H01L 21/677* | (2006.01) |
| *F26B 5/00* | (2006.01) |

(52) U.S. Cl.
CPC .... *H01L 21/67017* (2013.01); *H01L 21/67028* (2013.01); *H01L 21/67034* (2013.01); *H01L 21/6735* (2013.01); *H01L 21/67769* (2013.01); *F26B 5/00* (2013.01)
USPC .......... 34/559; 34/427; 134/1; 134/2; 134/21; 134/11; 134/31; 250/455.11

(56) References Cited

U.S. PATENT DOCUMENTS

| | | | |
|---|---|---|---|
| 5,263,264 A * | 11/1993 | Usui et al. ................ 134/21 |
| 5,273,589 A * | 12/1993 | Griswold et al. .......... 134/21 |
| 5,732,478 A | 3/1998 | Chapman et al. |
| 5,755,039 A * | 5/1998 | Mae et al. .............. 34/60 |
| 5,811,763 A * | 9/1998 | O'Rorke ................ 219/411 |
| 5,830,279 A | 11/1998 | Hackenberg |
| 5,896,674 A | 4/1999 | Kim et al. |
| 6,170,171 B1 * | 1/2001 | Schmidbauer et al. ......... 34/406 |
| 6,202,318 B1 | 3/2001 | Guldi et al. |
| 6,357,457 B1 | 3/2002 | Taniyama et al. |
| 6,725,565 B2 | 4/2004 | Harano et al. |
| 7,897,188 B2 * | 3/2011 | Wilbers ................ 426/233 |
| 2003/0021724 A1 * | 1/2003 | McVey .............. 422/28 |
| 2005/0081890 A1 | 4/2005 | Ato et al. |
| 2007/0086911 A1 * | 4/2007 | Yamazaki et al. ............... 422/1 |
| 2009/0144015 A1 * | 6/2009 | Bedard ................ 702/130 |
| 2009/0263216 A1 * | 10/2009 | Favre et al. ............. 414/222.02 |
| 2010/0206862 A1 * | 8/2010 | Defranco et al. ........... 219/201 |
| 2010/0319211 A1 * | 12/2010 | He et al. ............... 34/403 |
| 2012/0285038 A1 * | 11/2012 | He et al. ............... 34/553 |

FOREIGN PATENT DOCUMENTS

| | | |
|---|---|---|
| DE | 42 30 899 | 3/1993 |
| DE | 10 2005 004912 | 8/2006 |
| EP | 0421902 | 4/1991 |
| EP | 0455465 | 11/1991 |
| EP | 0924487 | 6/1999 |
| EP | 1 574 265 | 9/2005 |
| EP | 1 630 858 | 3/2006 |
| EP | 1674812 | 6/2006 |
| FR | 2 626 366 | 7/1989 |
| GB | 1479453 | 7/1977 |
| JP | 59 161826 | 9/1984 |
| JP | 62163323 | 7/1987 |
| JP | 4242930 | 8/1992 |
| JP | 0684877 | 3/1994 |
| JP | 0745574 | 2/1995 |
| JP | 8122232 | 5/1996 |
| JP | 08338659 | 12/1996 |
| JP | 2002126678 | 5/2002 |
| JP | 2003142451 | 5/2003 |
| JP | 2003254045 | 9/2003 |
| JP | 2005140536 | 6/2005 |
| WO | WO 00/40910 | 7/2000 |

* cited by examiner

METHOD FOR TREATING A TRANSPORT SUPPORT FOR THE CONVEYANCE AND ATMOSPHERIC STORAGE OF SEMICONDUCTOR SUBSTRATES, AND TREATMENT STATION FOR THE IMPLEMENTATION OF SUCH A METHOD

TECHNICAL FIELD OF THE INVENTION

The present invention relates to a method for treating transport supports for the conveyance and atmospheric storage of substrates, such as transport pods for semiconductor wafers or reticles, with the transport supports having possibly undergone prior cleaning using a liquid, such as washing with pure water.

The present invention also includes a treatment station for the implementation of such a method.

Transport and storage pods establish a confined space under atmospheric pressure, separate from the substrate transport and usage environment, for the transport and storage of one or more substrates.

In the semiconductor manufacturing industry, these pods are used to transport the substrates, such as semiconductor wafers or reticles, from one device to another, or to store the substrates between two manufacturing stages.

A distinction is made in particular between front opening unified pods (FOUP) for transporting and storing wafers and bottom opening standard mechanical interface pods (SMIF pod), "open cassette" pods, Reticle SMIF Pods (RSP) for the transport and storage of reticles, pods for the transport of substrates for the solar industry.

These transport pods are made of materials such as polycarbonate, which may in certain cases concentrate contaminants and in particular organic, base, amine, acid and dopant contaminants (AMC), which may result from the manufacturing of transport pods and/or their use.

Furthermore, during the manufacturing of the semiconductors, the transport pods are handled, which leads to the formation of pollutant particles which become lodged in the walls of the transport pods, thus contaminating them. The particles adhering to the walls of the transport pods can then come loose, falling on the substrates stored in these pods and damaging them.

Regular cleaning of these pods is therefore planned, washing them with a liquid such as deionized water. This washing stage, which lasts between 5 and 7 minutes, is followed by a much longer drying stage (between 5 and 8 hours) including for example a phase in which the transport pods are heated by convection of hot air heated by infrared radiation, and centrifuged, followed by a phase in which the transport pods are left in the open air.

Residue of cleaning fluid and more particularly water vapor are major contaminants which need to be removed.

The disadvantage of the drying stage is that it is not effective enough.

The temperature of the air for heating by convection is limited to 50° C. since it is necessary to avoid damaging the material making up the transport pod and to avoid it becoming deformed, making it unsuitable for robotic use. Such a temperature is then too low to remove all the residual liquid.

Likewise, the rotation speed of the centrifuged transport pods is limited so as not to create new contaminating particles.

Water residue then remains trapped in the walls of the pods.
The drying is also noted as being inconsistent.

The transport pods have a complex geometry, containing many dead areas which are difficult to access and which form areas which trap humidity and other foreign bodies.

Furthermore, the transport pods do not all come from the same manufacturing process, and it may be that certain pods require longer drying times in the open air than others. Furthermore, certain pod walls are as new, while others have already been handled often and present a more porous surface.

Even after a long spell in the open air, certain transport pods remain damp.

Furthermore, drying in the open air requires the transport pods to be immobilized for several hours. On average, five to eight hours are required for the desorption flow of the walls of the pods to reach a sufficiently low and acceptable level.

Manufacturers therefore plan the installation of large drying rooms in which the transport pods are stored while waiting for them to dry completely.

Likewise, large fleets of transport pods are required.

The installation and logistics management of these clean rooms, where the cleanliness, temperature, humidity and pressure of the atmosphere must sometimes be regulated, constitute a major and expensive investment.

Furthermore, the increasingly demanding contamination criteria oblige the manufacturers to increase the cleaning frequency of the transport pods and therefore to further increase the space required for their storage while awaiting the completion of the drying stage.

It is therefore necessary to ensure more effective and quicker cleaning of the transport supports such as transport pods.

One difficulty is that the material which makes up the majority of a transport support is generally porous, liable to contain foreign bodies which need to be removed or blocked.

Another difficulty is that a transport support would not support contact cleaning, which would run the risk of generating pollutant particles.

The possibility of microwave radiation to heat the residual humidity and help to remove it was considered. However, this method can not be used with new generations of transport supports which include metal elements and RF wave identification devices, which cannot be earthed.

An additional constraint is that the surface contamination of the transport support must be minimal: generally the inner surface of the transport support must not contain any particles larger than 65 nm, it must not contain any humidity, and it must not contain interfering electrical charges.

DISCLOSURE OF THE INVENTION

The aim of the present invention is thus to propose a method and a treatment station for transport supports, which considerably improve and accelerate the removal of foreign bodies, in particular molecular contamination compounds (AMC, VOC) and/or humidity after a washing stage, used to reduce their immobilization time and to ensure satisfactory cleanliness of the walls of transport supports.

In practice, the invention aims to ensure treatment in under 10 minutes, without degrading or deforming the transport support, and without creating interfering electrostatic charges.

To this end, the invention proposes a method of treating a transport support for the conveyance and storage of substrates, including a treatment stage during which a surface to be treated on the transport support is subjected to the combined action of a subatmospheric gaseous pressure and infrared radiation to remove the foreign bodies from said surface to be treated.

Thanks to this combined action of the subatmospheric gaseous pressure and the infrared radiation acting on the surface to be treated, the removal of the foreign bodies is particularly quick and complete, providing an unexpected means of having a clean transport support in the required time, in other words in under 10 minutes, without degrading or deforming the transport support.

To reach as short a treatment time as possible, of under 10 minutes approximately, the aim is to reduce as far as possible the gaseous pressure to which the surface to be treated, is subjected. However, too low a pressure accelerates the evaporation and simultaneously lowers the temperature of the liquids, and it is essential to avoid the solidification of the liquid foreign bodies to be removed, since such a solidification considerably extends the time taken to remove these foreign bodies, and makes it near-impossible to detect the end of the treatment, meaning that the quality of cleaning obtained is not satisfactory.

To avoid such an inopportune solidification, during the method of the invention it may advantageously be ensured that the subatmospheric pressure remains greater than the pressure of the triple point of the diagram of the phases of the liquid foreign bodies to be removed.

Simultaneously it is of interest to increase the efficiency of the infrared radiation in order to place the foreign bodies to be removed at a sufficiently high temperature to avoid their solidification, while maintaining this temperature below a permissible temperature limit beyond which the transport support may be degraded, for example by a deformation making it unsuitable for robotic use, or for example by a structural modification of the material making it porous and sensitive to pollution.

For this reason, the infrared radiation should preferably have an emission spectrum with maximum intensities of around the absorption wavelength(s) of the foreign body or bodies to be removed.

Preferably, the infrared radiation may be intermittent radiation, which may include an initial continuous stage of setting the surface to be treated to the appropriate temperature. The radiation thus acts preferably on the water-based foreign bodies to be removed, and the initial stage is used to accelerate the setting to the appropriate temperature, thus considerably reducing the treatment time. Furthermore, this is used to separately control the infrared emission spectrum and the temperature of the surface to be treated.

In practice, to carry out the intermittent radiation, a test temperature can advantageously be measured which is representative of the temperature of the surface to be treated, and the infrared radiation can be controlled in accordance with said test temperature, so as to maintain said temperature of the surface to be treated in the vicinity of a temperature setting below a maximum permissible temperature threshold. This thereby allows getting as close as possible to the maximum permissible temperature, and thus reduces the treatment time.

Also with a view to reducing the treatment time, setting the pressure as low as possible, the subatmospheric gaseous pressure can advantageously be measured and compared with a pressure setting to control, depending on the comparison, means of adjusting the pressure such as a pumping speed, a pumping conductance, a gaseous flow injection conductance, to bring the subatmospheric gaseous pressure to around the pressure setting and maintain it at that level.

As previously indicated, one of the difficulties in removing the foreign bodies lies in the complex shape of the transport supports. This complex shape includes trap areas or recesses in which foreign bodies can accumulate and thus become very difficult to remove.

The time to remove foreign bodies from these recess areas can be further reduced by allowing for a stage in which a localized gaseous flow is injected close to at least one area where foreign bodies are trapped on the surface to be treated. The localized gaseous flow contributes to the removal of the pollutant elements of the trap area, considerably reducing the treatment time. The gas used may for example be nitrogen or helium, the latter being more effective and allowing the treatment time to be reduced further still.

At the end of the treatment, a conditioning stage can advantageously be included during which the surface to be treated is subjected to a progressive drop in temperature to around the ambient temperature and to a simultaneous progressive increase in gaseous pressure to around the atmospheric pressure with injection of a clean gas flow, free from foreign bodies to be removed.

The clean gas flow is used, during this stage, to saturate the surface area to be treated with clean gas molecules, which then avoids the treated surface becoming polluted again by the ambient atmosphere through a sponge effect during the rise in pressure and the cooling.

The clean gas flow should advantageously be chosen at a sufficiently low speed, for example below 0.4 m/s at around atmospheric pressure, but widely distributed to allow a high flow rate, thus avoiding the creation of interfering electrostatic charges and the entrainment of pollutant particles.

With such a considerable gaseous flow but at a low speed, the steam phase is evacuated close to the liquid residues, and the liquid-steam balance is thus shifted, thereby accelerating the treatment.

For economic and safety reasons, at the end of the subatmospheric process, nitrogen or air should preferably be used.

According to one advantageous embodiment, a parameter can be measured which is representative of the removal of the foreign bodies from the surface to be treated, and the treatment is interrupted once the representative parameter reaches a reference value.

In this way, an effective treatment can be ensured, adapting the treatment to the actual conditions presented by the transport support before the treatment.

For example, the representative parameter may be the weight of the transport support, or the quantity of humidity or AMC at the outlet of the vacuum pump, or partial or total gaseous pressure in the sealed chamber.

According to another aspect, the invention plans for a transport support treatment station for the conveyance and storage of substrates, containing:
- a sealed chamber intended to be connected to pumping devices and suitable for receiving at least one transport support with a surface to be treated,
- at least one source of infrared radiation, suitable for subjecting said surface to be treated to infrared radiation,
- control devices suitable for controlling the pumping devices and the source of infrared radiation for subjecting said surface to be treated to the combined action of a subatmospheric gaseous pressure and infrared radiation.

Such a station is used to implement the method defined above, and to obtain a very short treatment time and effective treatment.

Preferably, the treatment station should contain at least one temperature sensor, placed in the sealed chamber, and suitable for measuring a test temperature representative of the temperature of the surface to be treated.

It is therefore possible to know the temperature of the surface to be treated at all times, and to memorize it if required, to ensure there is no degradation.

In practice, according to one specific embodiment, the temperature sensor contains a test layer, made of a material similar to that which makes up the transport supports to be treated, of a low thickness, one face of which is subjected to said infrared radiation, and the opposite face of which is in contact with a temperature probe.

In this way, the temperature sensor can be indwelling in the sealed chamber, and it does not need to be moved or wired during the stages for inserting or removing transport supports in the sealed chamber.

The temperature of the test layer is in principle very similar to the temperature of the surface to be treated and, due to the low thickness of the test layer, the temperature probe can measure a temperature very close to that of the surface to be treated.

Preferably, the control devices should include an infrared control program, which examines the temperature data produced by the temperature sensor, which triggers the power supply of the infrared radiation source when the temperature measured by the temperature sensor is lower by more than a pre-determined difference than a temperature setting, itself lower than a maximum permissible temperature threshold, and which interrupts the power supply of the infrared radiation source when the temperature measured by the temperature sensor exceeds said temperature setting by more than a pre-determined difference.

The treatment station is thus used to maintain a temperature as close as possible to the maximum permissible temperature threshold, to further reduce the treatment time.

It is beneficial for the source of infrared radiation to be able to irradiate essentially the surface areas to be treated containing foreign bodies to be removed, in particular concave areas and other trap areas.

In practice, therefore, the source of infrared radiation may include at least one source part suitable for being inserted inside a transport support in the form of a box. The treatment time is thus reduced.

To also reduce the treatment time, initial gas injection devices can also advantageously be planned to inject a first localized gaseous flow in the vicinity of the surface to be treated.

Conversely, during the repressuring, it is preferable for the injected gases to produce a distributed flow at low speed. Second gas injection devices can then advantageously be planned to inject a clean gas flow into the sealed chamber separate from the surface to be treated.

According to one advantageous embodiment, the treatment station may include devices for measuring a parameter representative of the removal of the foreign bodies from the surface to be treated, and it may be planned for the control devices to be suitable for interrupting the treatment when the representative parameter reaches a reference value.

In practice, the treatment station may include at least one electronic scale positioned to be able to measure the weight of at least one transport support and to produce a weight signal, and means of processing the weight signal to deduce from said weight signal the end of the treatment stage.

The scale may contain an electrical feedback circuit containing at least one compensation winding placed in a magnetic field of permanent magnets so as to be able to generate electromagnetic compensation when a transport support applies a force to said scale.

As an alternative, the treatment station may advantageously contain a humidity and/or AMC sensor at the outlet of the vacuum pump of the pumping devices, and/or the pressure gauges of the sealed chamber.

The treatment station may have other characteristics, which may be taken separately or in combination, in particular:
  a gasket placed on the periphery of an opening of the chamber, opposite a closing cover of the chamber, and including at least one cylinder suitable for compressing the gasket in the closed position of the chamber,
  a device for damping the vibrations placed between a lower face of the frame of said station and the floor,
  a control device for the gaseous species containing a derived excitation cell connected to the chamber and containing an electromagnetic excitation antenna suitable for forming a plasma inside said cell.

The treatment station can furthermore be connected to equipment for cleaning a transport support with a liquid, containing a device to convey the transport support from said cleaning equipment to said treatment station.

The invention also applies to treatment equipment containing a vacuum pump and at least one treatment station as described previously.

SUMMARY DESCRIPTION OF THE DRAWINGS

Figure 2:
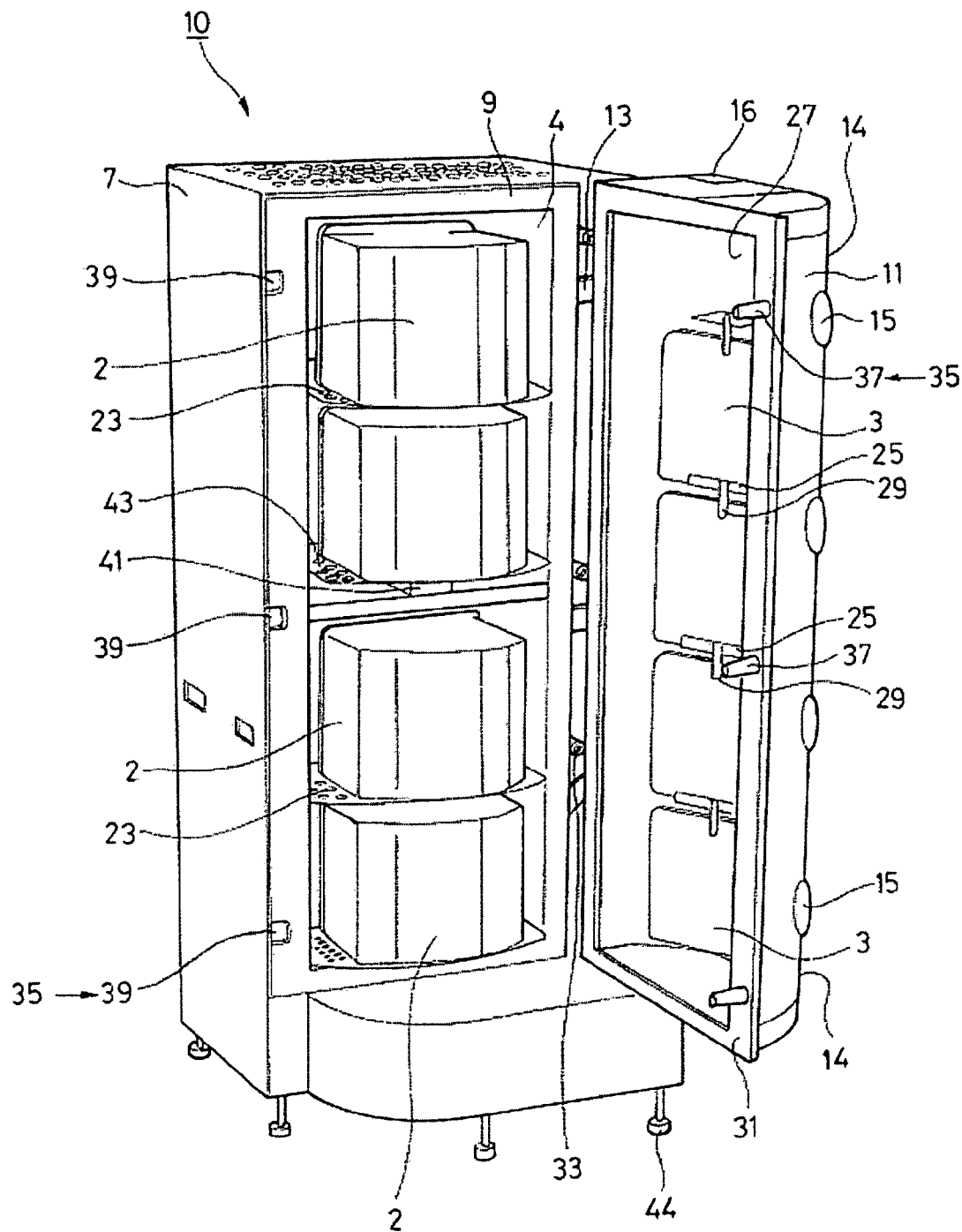
Figure 3:
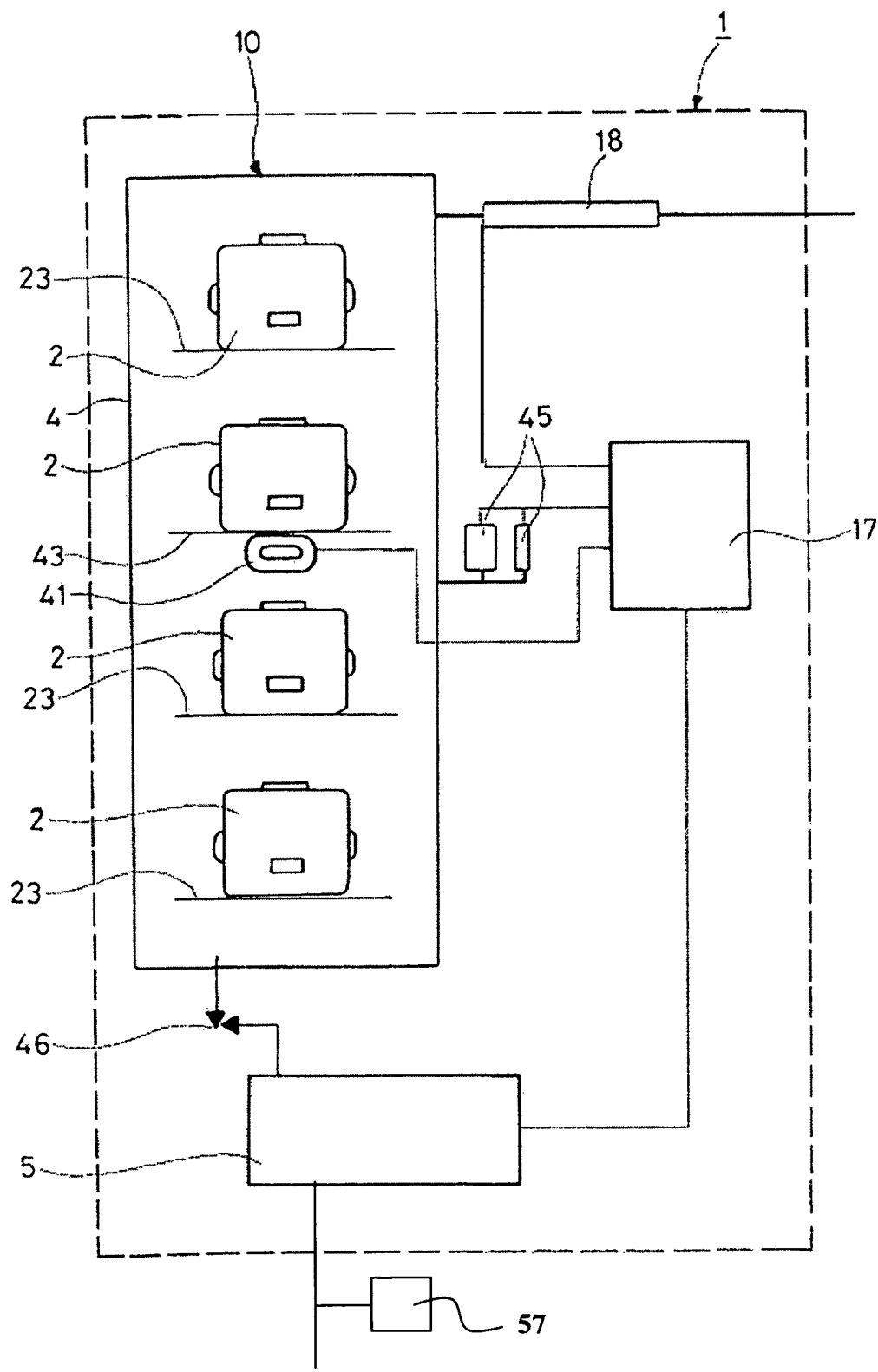
Figure 4:
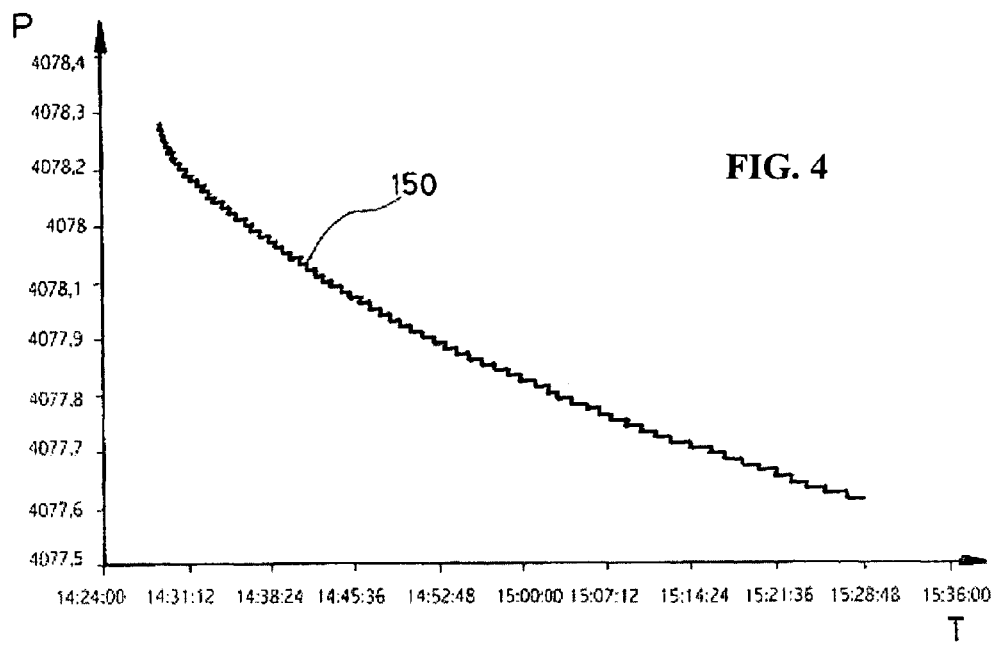
Figure 5:
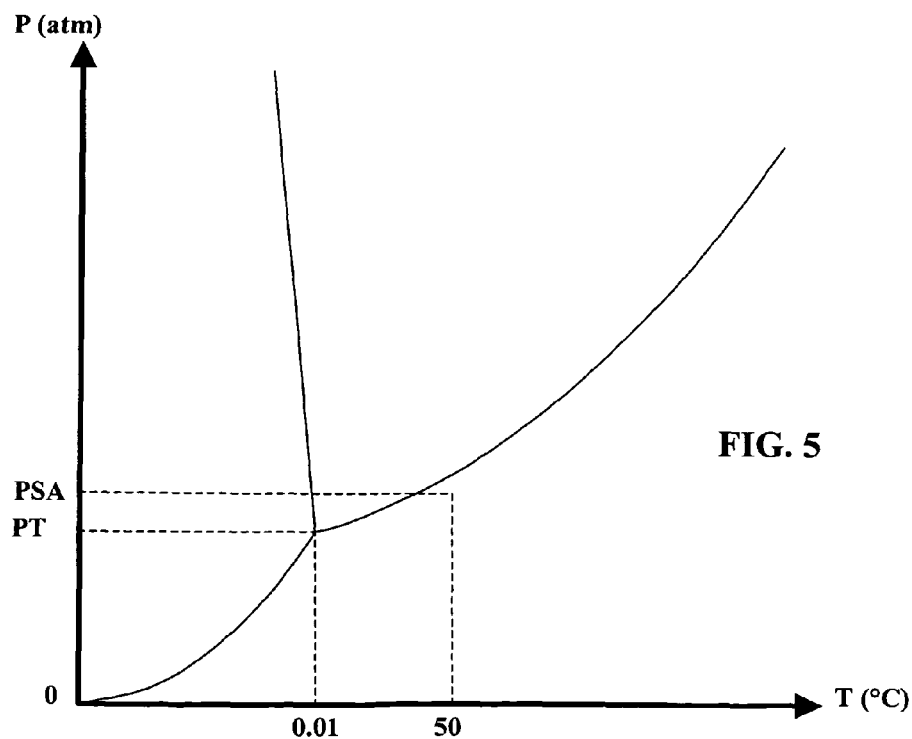
Figure 6:
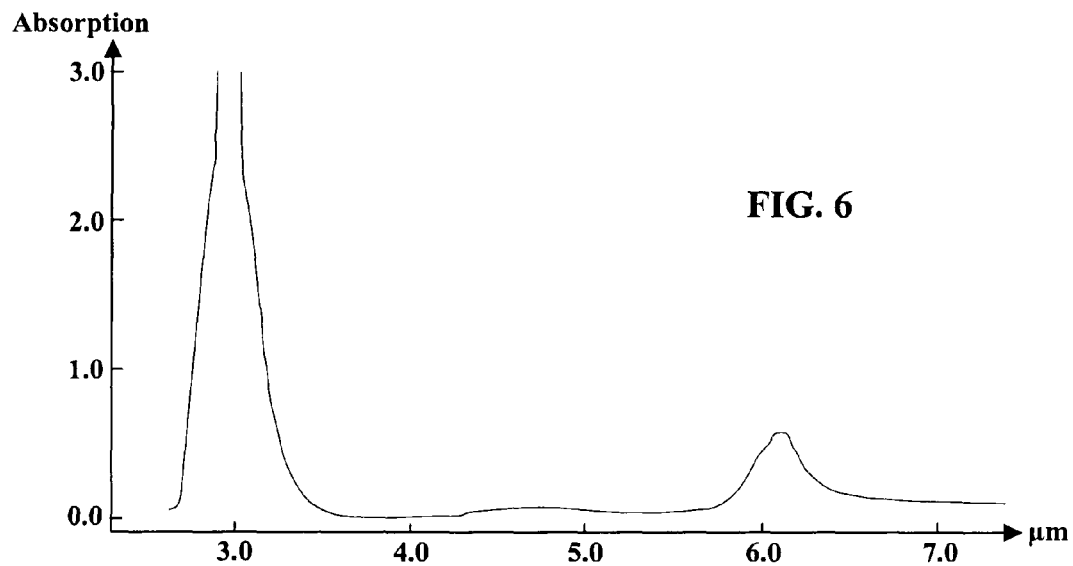
Figures 7, 8, 9:
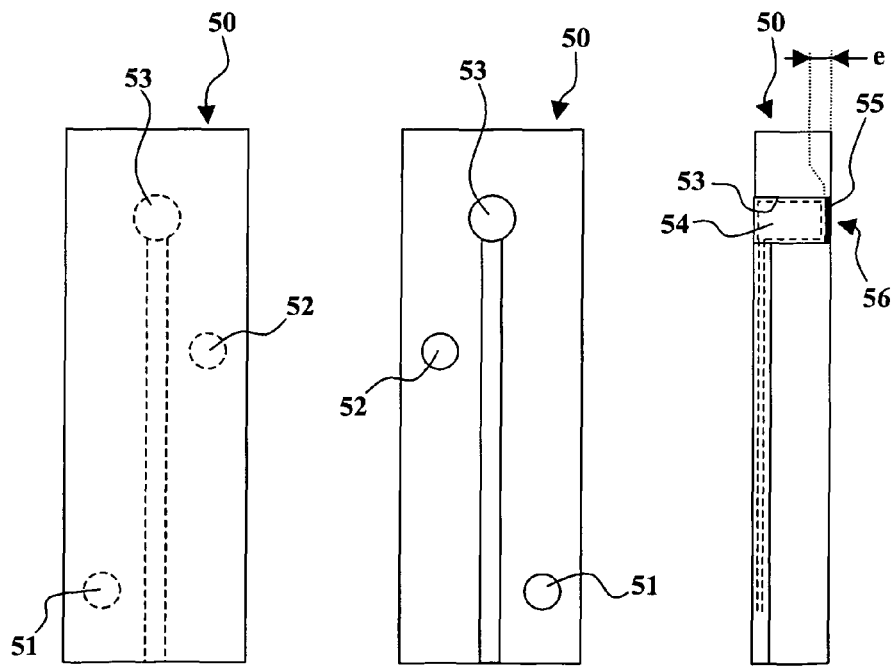
Figure 10:
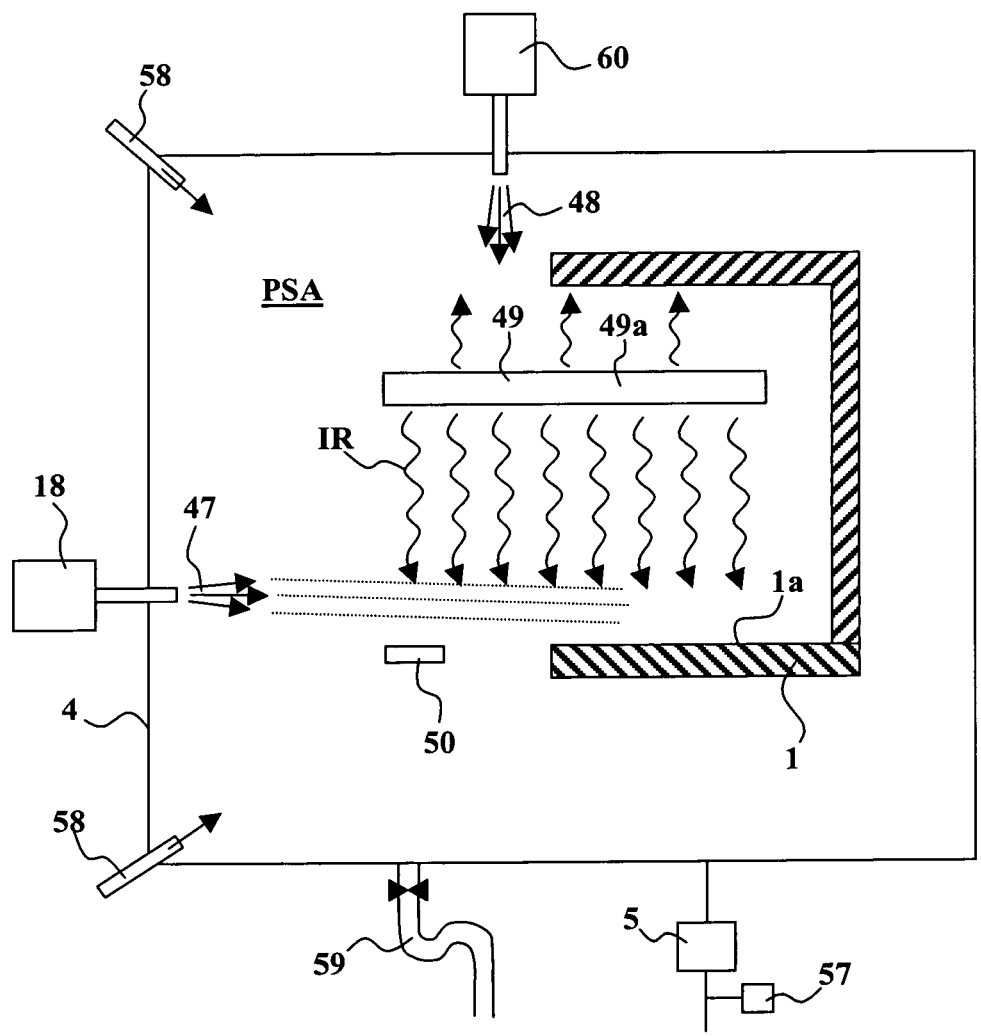

Other advantages and characteristics shall become apparent upon reading the description of the invention, produced in connection with the attached drawings, in which:

FIG. 1 is a flow diagram showing the different stages of a method according to one embodiment of the invention, FIG. 2 is a perspective side view of a treatment station in the open position, according to one embodiment of the invention, FIG. 3 represents an overview diagram of the treatment station in FIG. 2, FIG. 4 represents a graph of the evolution of the measured weight of a transport support according to the time when placing in a vacuum, FIG. 5 shows the water phase diagram, FIG. 6 shows the curve for the absorption of infrared radiation by water;

FIGS. 7, 8 and 9 show, as a front view, rear view and a cross-section side view respectively, a temperature sensor according to one embodiment of the invention, FIG. 10 shows in diagram form the operation of the temperature sensor of FIGS. 7 to 9, and FIG. 11 is a time diagram illustrating the variations in infrared radiation, temperature and pressure during the method.

DESCRIPTION OF THE PREFERRED EMBODIMENTS

In these attached figures, identical elements are given the same reference numbers.

For reasons of clarity, the stages of the method are numbered starting from 100, and the elements of the station are numbered from 1 to 60.

FIG. 1 shows a flow diagram of a treatment method (inside the rectangle 100 in dashed lines) of a transport support for the conveyance and storage of substrates.

This method applies to a transport support 1, as shown in FIG. 2, which may for example have previously undergone cleaning with a liquid, such as washing with deionized water according to stage 101 shown in FIG. 1.

The transport support 1 is a means for the conveyance and atmospheric storage of substrates such as semiconductor wafers, reticles, thin films for the solar industry.

For example, the transport support 1 is a casing 2 of a transport pod, a pod door 3 and/or the transport pod itself. The transport pod may in particular be a unified transport pod of the type FOUP, SMIF Pod, RSP or "Open Cassette", or a transport pod for substrates for solar sensors.

The method according to the invention is characterized in that it includes a treatment stage, illustrated in FIGS. 3 and 10, during which the transport support 1 is placed in a sealed chamber 4 connected to a vacuum pump 5 (stage 102) and a surface to be treated 1a of the transport support 1 is subjected to the combined action of a subatmospheric gaseous pressure PSA through the vacuum pump 5 (stage 103) and infrared radiation IR.

The treatment of the walls allows both drying to a satisfactory level after only around ten minutes, and optimization of the degassing of the walls.

This treatment of the transport support 1 aims to remove, through drying and desorption, the liquid residues and those in the form of steam, and sometimes even certain solid residues, in particular of cleaning agents such as water.

Furthermore, it is observed that the method is used to obtain transport supports for which the desorbed flow level, and therefore the level of drying, is completely reproducible from one support to another, unlike the methods of the prior art.

In the drying methods of the prior art, firstly the water vapor residue could remain lodged in the dead areas of the transport supports 1, and secondly the degassing level depended on the history of the transport supports.

The reproducibility of the method is therefore used to ensure that after a same treatment method following liquid cleaning, the transport supports 1 have the same level of cleanliness.

For example, transport support 1 is subjected to a primary vacuum for which the subatmospheric pressure PSA is lower than 1000 mbar, and preferably around 100 mbar or around 10 mbar, with it being observed that the subatmospheric pressure PSA remains greater than the pressure PT of the triple point of the diagram of the phases of the foreign bodies to be removed. For example, in the case of water as the foreign body to be removed, the pressure PT of the triple point is 6 mbar (see FIG. 5).

To remove to an even lower level the degassing flow of the walls of the transport supports 1, after removal of the liquid foreign bodies such as water on the surface to be treated 1a, the transport support 1 can be subjected to a secondary vacuum for which the subatmospheric pressure is lower than 0.1 mbar, and preferably around 0.001 mbar.

It can therefore be planned, for example, to start subjecting the transport support 1 to primary pumping then, when the required drying level is obtained, to switch to secondary pumping.

According to the method, the transport support 1 is heated by infrared radiation IR while transport support 1 is subjected to subatmospheric pressure PSA.

The transport support 1 is heated to a pre-defined temperature by the infrared radiation IR.

The power emitted from the radiation IR is controlled by measuring the temperature TM of the transport support 1 material, to avoid exceeding the maximum permissible temperature TA of the transport support 1 material.

Figure 11:
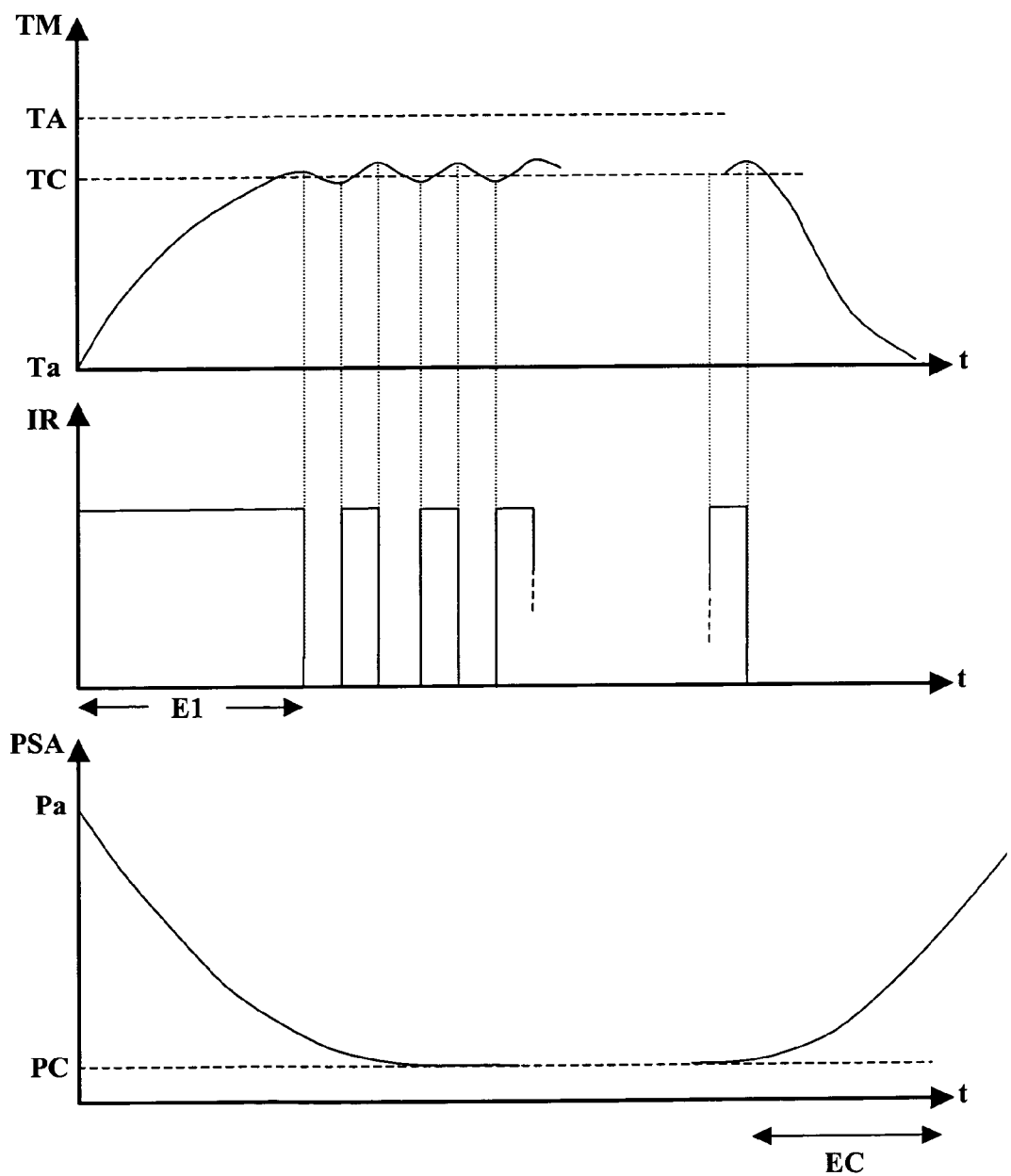

FIG. 11 shows a preferred embodiment for the infrared heating process. In this case, the infrared radiation IR is intermittent. It advantageously contains a continuous initial stage E1 of setting the surface to be treated 1a to the appropriate temperature. Then, the infrared radiation IR is alternately cut off and restored for satisfactory durations to maintain the temperature of the material TM at around a temperature setting TC. Simultaneously, allowing for intermittent infrared radiation allows the temperature of the surface to be treated 1a to be controlled while controlling the wavelength spectrum of the infrared radiation generation devices.

During the initial stage E1 in which infrared emission is continuous, the temperature TM of the material rises rapidly until it reaches the temperature setting TC. Then the temperature TM is maintained at around the temperature setting TC, which itself is below a maximum permissible temperature threshold TA.

In practice, a test temperature representative of the temperature TM of the surface to be treated 1a is measured, and the infrared radiation IR is controlled according to said test temperature: when the temperature TM exceeds the temperature setting TC by a pre-determined difference, for example one degree, the infrared radiation IR is interrupted. Then, when the temperature TM drops below the temperature setting TC by a pre-determined difference, for example one degree, the infrared radiation is restored. The result is a temperature TM curve as shown in the time diagram of FIG. 11.

Furthermore, the infrared radiation IR wavelength emission spectrum can be chosen in such a way that the heating takes place on the surface and in the first layers inside the material of the transport support 1, and that it takes place preferably on the liquid foreign bodies to be removed. A wavelength of around 3 μm is therefore advantageous to remove the water.

It is also possible to choose to have infrared radiation act on two or more different wavelengths liable to be absorbed selectively by two or more types of elements to be removed.

In practice, the infrared radiation IR may advantageously have an emission spectrum with maximum intensities of around the absorption wavelength(s) of the foreign body or bodies to be removed.

The temperature setting TC is advantageously greater than the ambient temperature, and preferably around 50° C.

It is essential for the subatmospheric pressure PSA to be as low as possible, but remain permanently higher than the pressure PT of the triple point of the bodies to be removed, otherwise the liquid bodies to be removed may solidify and their removal becomes very slow. For this reason, the gaseous pressure PSA can advantageously be measured inside the sealed chamber 4 and compared with a pressure setting PC to control, depending on the comparison, means of adjusting the pressure, such as a pumping speed, a pumping conductance 46, a gaseous flow injection conductance 18, to bring the subatmospheric gaseous pressure PSA to around the pressure setting PC and maintain it at that level.

It has been noted that a considerable acceleration in the treatment can be obtained by injecting a localized gaseous flow 47 close to the trap areas for the foreign bodies on the surface to be treated 1a of the transport support 1. Such a localized gaseous flow 47 (FIG. 10) favors the entrainment of the molecules and particles in the vicinity of the surface to be treated 1a.

Preferably the return to the vicinity of the ambient temperature and the atmospheric pressure takes place maintaining the transport support 1 inside the sealed chamber 4, since cooling favors the absorption of a clean gas which can be used to set the sealed chamber 4 to the atmospheric pressure, and which passivates the surface to be treated 1a.

In practice, a conditioning stage EC can advantageously be planned (FIG. 11), during which the surface to be treated 1a is subjected to a progressive rise in gaseous pressure PSA to around the atmospheric pressure Pa, and to a drop in temperature TM to around the ambient temperature Ta with injection of a clean gas flow 48, free from foreign bodies to be removed. The clean gas flow 48 (FIG. 10) is not localized, in other words it must be distributed in the sealed chamber 4. The clean gas flow 48 is chosen at a sufficiently low speed and widely distributed to allow a high flow rate and avoid the creation of interfering electrostatic charges and the entrainment of pollutant particles on the surface to be treated 1a.

It can be assumed that the time required for the treatment will be roughly equivalent for pods of the same type which have preferably undergone the same prior washing stage. In this case, the treatment can be interrupted following a pre-defined duration characteristic of the type of transport support 1, from which the transport support 1 is subjected to subatmospheric pressure.

According to one advantageous variant shown on the flow diagram of FIG. 1, a parameter is measured which is characteristic of the removal of the foreign bodies from the surface to be treated 1a of the transport support 1 (stage 104), and the evolution of this parameter is compared with a reference (stage 105), in other words a reference value or a reference curve, which takes into account the type of transport support 1.

The reference is characteristic of a satisfactory level of desorption of the transport support 1, and therefore of the drying, and the treatment can be interrupted when the representative parameter reaches the reference.

Each type of transport support 1 can be characterized by a set of physical parameters such as the size, the material, the structure, the geometry. In particular there are unified types of pods, such as an FOUP type pod, an SMIF Pod, an RSP or "open Cassette" type pod, or the transport pods for substrates for solar sensors.

An increase in the pressure in the sealed chamber 4 can then be planned to the atmospheric pressure as soon as possible once the measured parameter is equal to or below the reference.

The atmospheric pressure Pa is the pressure of the transport supports 1 in their usage environment, such as the atmospheric pressure of the clean room.

When the measured parameter is equal to or lower than the reference, the desorption flow level has reached a sufficiently low level.

In this case, the choice can be made either to increase the pressure in the sealed chamber 4 and to remove the transport support 1 (stage 106), or to store the transport support 1 in a vacuum so that it continues to desorb its walls while waiting either to be reused, or to free up space in the sealed chamber 4 (stage 107).

According to one possibility, the characteristic parameter is the total or partial pressure of the gas in the sealed chamber 4.

The measurement of the total pressure in the limit vacuum state of the pumping is an indicator of the desorbed flow in the sealed chamber 4, coming mainly from the degassing of the transport support 1 to be treated.

This measurement method is extremely effective for high gas flows (of around a few sccm). However, when the desorption flows are relatively low (less than a few sccm), this measurement technique may lack accuracy.

Furthermore, when a gaseous flow 47 is injected into the sealed chamber 4, the signal of the desorption flow may be drowned with that of the injected flow.

It is also possible for the method to contain an additional purge stage comprising a purge gas filling operation during which a purge gas is introduced into the sealed chamber 4, and a purge gas pumping operation during which the mixture of the purge gas and the initial gas is extracted from the sealed chamber 4 by pumping.

According to another possibility, the characteristic parameter is the measured weight of the transport support 1.

The value of the weight varies with the removal of the foreign bodies and with the degassed flow of the walls of the transport support 1.

The measurement may preferably be started from the steady state of the vacuum pump 5 to avoid disturbances to the measurement due for example to the buoyancy experienced by the transport support 1 and to the flow movements in the sealed chamber 4.

FIG. 4 is a graph in which the weight P in grams is given on the ordinate and the time T in hours, minutes and seconds is given on the abscissa. The curve 150 represents the measured weight of the transport support 1 according to the time when the sealed chamber 4 is placed in a vacuum.

It is noted that the weight of the support 1 reduces with the increase in time. The walls of the transport support 1 degas in a vacuum. The weight measurement is therefore a good indicator of the treatment level of the transport support 1.

According to another possibility, the reference can be the quantity of humidity or AMC at the outlet of the vacuum pump 5.

Advantageously, the reference may be a pre-defined temporal variation of the characteristic parameter.

Thus when the temporal variation of the pressure or the measured weight becomes too low, the desorbed flow according to the time may no longer be high enough to justify keeping the transport support 1 in a vacuum.

Alternatively, the reference may be a pre-defined threshold value.

To illustrate the efficiency of the treatment method according to the invention, tests have been carried out on specimens placed in a sealed chamber 4 and subjected to the different actions of the method.

In all cases, infrared radiation IR was used on the specimen.

The speed of the treatment was compared between a first case at atmospheric pressure and a second case at a pressure close to the triple point of water (10 mbar): the gain in speed was 67% in cases of a pressure close to the triple point.

The importance of correct maintenance of the pressure was tested, by comparing an excessively low pressure (6 mbar) leading to the formation of ice, and a correct pressure (6.7 mbar) ensuring the absence of any ice formation throughout the drying time. The gain in speed was 57%. The effect of inserting a gaseous flow to ensure the maintaining of the pressure was then researched, for the same pressure of 50 mbar. The insertion of a gaseous flow allowed a gain of 13% in speed, compared to treatment without gaseous flow.

The effect of positioning the surface to be treated 1a in relation to the inserted gaseous flow was then researched. It was found that by positioning the surface to be treated 1a in the path of the injected gaseous flow, a gain in speed of 19% can be obtained.

The effect of the nature of the gas injected was also researched. Using helium, a 22% gain in speed was obtained compared to an injection of nitrogen, in the same conditions.

Furthermore, tests were carried out on FOUP type transport supports, measuring the residual degassing of the transport support following treatment:

a) after heating by infrared radiation (50° C.) at atmospheric pressure Pa for 1 hour, the residual degassing was 2.5 sccm,
b) after placing in a vacuum without additional heating for 1 hour, the residual degassing was 0.77 sccm,
c) after placing in a vacuum with additional heating by infrared radiation (50° C.) for 1 hour, the residual degassing was 0.6 sccm.

This shows the synergy of a combination of the vacuum and the infrared radiation.

According to the invention, and as shown in FIG. 2, a treatment station 10 is also planned for a transport support 1, for the conveyance and atmospheric storage of substrates, for the implementation of a treatment method as described previously.

The station 10 contains at least one sealed chamber 4, preferably mounted on a frame 7.

The sealed chamber 4 of the treatment station 10 is intended to be connected to vacuum pump 5 pumping devices (see FIG. 3), and is suitable for receiving at least one transport support 1, such as a transport pod for substrates, with a surface to be treated.

The treatment station 10 contains at least one source of infrared radiation 49, suitable for subjecting the surface to be treated 1a of the transport support 1 to infrared radiation IR.

FIG. 2 shows a treatment station 10 receiving four FOUP type transport pods.

According to a first variant, the vacuum pump 5 is a primary vacuum pump.

Alternatively, the vacuum pump 5 can contain a conduit intended to be connected to a primary vacuum pump and a branch of the conduit upstream of the primary vacuum pump, intended to be connected to a secondary pump, so as to be able to switch from primary pumping to secondary pumping when implementing the treatment method.

The sealed chamber 4 is preferably cylindrical in shape and made of stainless steel to resist being placed in a vacuum. It also contains an opening 9 which can be blocked by a closing cover 11, advantageously mounted on a hinge 13 (FIG. 2).

The closing cover 11 advantageously contains, on the front face 14, at least one window 15, made of glass for example, allowing an operator to check whether or not a transport support 1 is present inside.

A window 15 is advantageously planned at the height of each transport support 1.

Furthermore, the front face 14 of the closing cover 11 advantageously contains a tower 16 for signaling the operating state of the treatment station 10, and a display screen (not visible) connected to a CPU 17 (FIG. 3) of the treatment station 10.

As can be seen on the diagram of FIGS. 3 and 10, the sealed chamber 4 contains means of introducing clean gas 60, such as means of introducing dry nitrogen, to set the sealed chamber 4 to atmospheric pressure after treatment of the transport support 1.

When the transport support 1 is a transport pod, it can advantageously be placed open in the sealed chamber 4, so as not to deform the wall of the pod when placing it in a vacuum.

For this, the treatment station 10 contains for example shelves 23, 25 intended to support each transport support 1.

As can be seen in FIG. 2, the treatment station 10 should preferably contain a first series of shelves 23 on which the casings 2 of pods are placed, along with a second series of shelves 25 on which the corresponding doors 3 are placed.

Advantageously, the second series of shelves 25 supports the doors 3 in the vertical position in an internal recess 27 of the closing cover 11.

The shelves of the second series of shelves 25 also contain, a locking tab 29 to hold the door 3 of the pod placed beneath it.

To limit the dimensions and to simplify the access to the transport supports 1, it is planned for the treatment station 10 to be suitable to receive the bulkiest part of the supports 1 in the fixed part of the sealed chamber 4, and the second part in the recess 27 of the closing cover 11.

The sealed chamber 4 also contains a door gasket 31 placed on the periphery of the opening 9, so as to seal the sealed chamber 4 when the closing cover 11 is in the closed position (not shown).

It is also planned for the treatment station 10 to contain at least one cylinder 33, preferably pneumatic, mounted on an articulation of the hinge 13 of the sealed chamber 4, to be able to compress the door gasket 31 in the closed position of the sealed chamber 4.

To further improve the guiding of the closing cover 11 on the opening 9, several cylinders 33 are planned, evenly spread along the length of the hinge 13 of the treatment station 10.

The preference is for three cylinders 33 located on the three articulations of the hinge 13, as shown in FIG. 2.

To ensure homogeneous compression of the door gasket 31, at least one guide 35 is also planned, consisting firstly of a pin 37, preferably connected to the cover 11, and secondly of a corresponding hole 39, placed in the periphery of the opening 9 of the sealed chamber 4, outside the door gasket 31.

There should preferably be as many guides 35 as there are hinge articulations, evenly spread along the side of the opening 9 of the sealed chamber 4 opposite the one containing the hinge 13, and roughly at the same height as the cylinders 33.

Therefore, when closing the sealed chamber 4, the closing cover 11 is first guided and centered by the pins 37 on the opening 9 of the sealed chamber 4.

Once put in place, the actuation of the cylinder 33 is used secondly to pin the closing cover 11 against the opening 9 and thus compress the door gasket 31, sealing the chamber 4.

This layout is used to limit the shear constraints on the door gasket 31 in the position of the hinge 13.

Alternatively, it is planned to have at least two guides 35 of the closing cover 11, placed roughly symmetrically on the edge of the opening 9 of the sealed chamber 4 to center the closing cover 11 on the opening 9 of the sealed chamber 4.

In this alternative embodiment, it is also planned to have a pump 5 dimensioned to be able to compress the door gasket 31 simply by placing the sealed chamber 4 in a vacuum.

In FIGS. 3 and 10, the treatment station 10 also includes control devices with a CPU 17, firstly to manage the placing of the sealed chamber 4 at subatmospheric pressure (PSA) using pumping devices, and secondly to control the source of the infrared radiation 49. In this way, the treatment station 10 is suitable for subjecting the surface to be treated 1a to the combined action of a subatmospheric gaseous pressure and infrared radiation IR.

For the control of the source of infrared radiation 49, as shown in FIG. 10, there is advantageously at least one temperature sensor 50, placed in the sealed chamber 4, and suitable for measuring a test temperature representative of the temperature TM of the surface to be treated 1a. The temperature sensor 50 is connected to the sealed chamber 4, and placed in an area which receives the infrared radiation IR in a similar manner to the surface to be treated 1a, coming from the radiation source 49. It is ensured that the action of the infrared radiation IR generates, on the temperature sensor 50, temperature rises similar to those experienced by the surface to be treated 1a.

In practice, the temperature sensor 50 may be produced as shown in FIGS. 7 to 9: the temperature sensor can be a generally plane-parallel plate of a material similar to the one which makes up the transport supports 1 to be treated, for example carbon loaded PEEK, around 60 mm long, around 20 mm wide, around 8 mm thick, with positioning holes 51 and 52 for attaching it to the wall of the sealed chamber 4, and with a blind hole 53 for inserting a temperature probe 54.

The blind hole 53 is blocked by a test layer 55, of a low thickness e (around 1 or 2 tenths of a millimeter), of which one face 56 is subjected to infrared radiation IR, with the opposite face in contact with the temperature probe 54. The low thickness e of the test layer 55 is used to ensure a low thermal inertia and a good reactivity of the temperature sensor 50.

In practice, the CPU control devices 17 include an infrared control program, which examines the temperature data produced by the temperature sensor 50, which triggers the power supply of the infrared radiation source 49 when the temperature measured by the temperature sensor 50 is lower by more than a pre-determined difference than a temperature setting TC, itself lower than a permissible temperature threshold TA, and which interrupts the power supply of the infrared radiation source 49 when the temperature measured by the temperature sensor 50 exceeds said temperature setting TC by more than a pre-determined difference.

In the embodiment illustrated in FIG. 10, the transport support 1 is a hollow transport box type element. In this case, the source of infrared radiation 49 advantageously includes at least one source part 49a suitable for insertion inside the transport support 1 in the form of a box. The infrared radiation source 49 is thus as close as possible to the concave box areas liable to trap the foreign bodies to be removed, and any possible shadow areas are reduced.

Still in the embodiment illustrated in FIG. 10, the treatment station also includes initial gas injection devices 18 to generate a first localized gaseous flow 47 in the vicinity of the surface to be treated 1a. This first localized gaseous flow 47 can be used as a means to maintain the gaseous pressure PSA in the sealed chamber 4 during the treatment. In this case, the CPU can manage the gaseous flow rate ensured by the initial gas injection devices 18.

However, for the conditioning stage EC, second gas injection devices 60 are planned to inject a clean gas flow 48 into the sealed chamber 4 separate from the surface to be treated 1a.

Furthermore, the CPU 17 can be connected to sensors used to check a parameter characteristic of the progress of the treatment. These sensors can be pressure gauges 45 (FIG. 3) of the sealed chamber 4, and/or the scale 41, and/or a humidity and/or AMC sensor 57 (FIG. 10) at the outlet of the vacuum pump 5.

Alternatively, or in addition for the pressure measurement, a control device (not shown) for the gaseous species can also be used, containing a derived excitation cell which can be connected, via a valve, to a conduit of the vacuum pump 5 or directly to the sealed chamber 4, to be in communication with the gases of the sealed chamber 4.

The control device for the gaseous species also contains an electromagnetic excitation antenna powered by a power generator, placed around the cell in such a way as to form a plasma inside this cell.

The light radiation emitted by the plasma is then detected and sent to an optical spectrometer. The emission can be carried out by an optical fiber, or by an adapted connector. The optical spectrometer generates images of the optical spectrum detected, and sends them for example to the CPU 17.

Advantageously, and to allow the station 10 to operate completely automatically, the CPU 17 may contain means of identifying the transport support 1, such as barcode readers, RFID readers (transducer) or a receiver.

According to another specific embodiment of the invention, the station 10 contains at least one electronic scale 41 positioned to be able to measure the evolution of the measured weight of at least one transport support 1.

The measurement of the weight can be correlated with the degassing flow of the walls of the transport supports 1, thus allowing their drying evolution to be determined.

For the measurement to be significant, the accuracy of the measurement is advantageously around one hundredth of a gram for a full scale of a few kilograms (around 4 kg for an FOUP type transport pod and around 700 g for an RSP type pod).

To limit interference due to the external environment, it is also planned for the treatment station 10 to include a means of damping the vibrations (not shown), placed between a lower face of the frame 7 of the station and the floor, preferably under the feet 44 of the station 10.

If the station 10 is suitable to contain several transport supports 1 and in order to limit the costs, the drying evolution of the transport supports 1 is determined by checking a single transport support 1.

It can be considered that the information resulting from the measurement of a transport support 1 can apply to the evolution of the drying of all the transport supports 1 in the event that these are of the same type and are taken from the same previous cleaning stage.

Therefore, and as shown in FIG. 2, the treatment station 10 contains for example three shelves or fixed platforms 23, intended to each receive one casing 2 of an FOUP type transport box and also contains a scale 41 beneath a mobile platform 43, suitable for measuring the weight of a fourth casing 2 of an FOUP type transport box.

Advantageously, the scale 41 contains an electrical feedback circuit containing at least one compensation winding placed in a magnetic field of permanent magnets so as to be able to generate electromagnetic compensation when a transport support 1 applies a force to the scale 41.

After reading the zero, the compensation force required for the balance of the scale 41 is proportional to the weight on the platform 43, and the intensity of the current is thus converted to weight.

According to one embodiment variant, the treatment station 10 is connected to washing equipment of a transport support (not shown).

In this variant, it is planned for the station 10 and/or the equipment to contain a means of conveying the transport support 1 for transport from the washing equipment to the sealed chamber 4 of the treatment station 10.

For example, the means of conveyance is a handling robot for the transport support 1 or a conveyor belt.

There may also be a transfer chamber between one or more treatment stations 10 and washing equipment (not shown).

There may also be treatment equipment containing a vacuum pump 5 and at least one treatment station, preferably suitable for receiving a single FOUP type transport support 1.

Therefore, in operation, the treatment station 10 is suitable for implementing a treatment method following a washing stage.

Start by placing the transport support 1 in the sealed chamber 4 which is closed using the cover 11.

Then evacuate the gas contained in the sealed chamber 4 using the pump 5, and generate infrared radiation IR.

The evacuation of the gas by pumping, and the infrared radiation IR, may advantageously be stopped depending on the result of the comparison of the evolution of the parameter characteristic of the progress of the dehumidification with the reference.

Then leave the transport support 1 to cool and increase the pressure of the sealed chamber 4 to the atmospheric pressure through the introduction of clean gas through the second gas introduction devices 60, then open the closing cover 11 to remove the transport support 1 from the sealed chamber 4.

According to another embodiment, the treatment station 10 may also include washing devices 58 such as fixed or mobile jets, with run-off means 59, allowing the transport supports 1 to be washed directly in the sealed chamber 4 itself, before the vacuum treatment stage. The use of handling devices is thus avoided, along with the associated risks of recontamination. The overall treatment time is reduced. The effectiveness of the treatment is also enhanced through simultaneous decontamination and a control of the washing devices themselves. This also reduces the costs and saves space.

Through the treatment method according to the invention of a transport support, and through the use of a treatment station according to the invention implementing the method, the transport support 1 is placed in a vacuum and its surface to be treated 1a is selectively heated. This favors the evaporation of liquids on the walls of the transport support 1, and in particular in the first layers of the material of the support, and thus accelerates the treatment for the removal of foreign bodies.

The present invention is not limited to the embodiments that have been explicitly described; rather, it includes any variations and generalizations within the reach of a person skilled in the art.

The invention claimed is:

1. A treatment method of a transport support for the conveyance and storage of substrates, including a treatment stage during which a surface to be treated on the transport support is subjected to the combined action of a subatmospheric gaseous pressure and heating using intermittent infrared radiation to remove foreign bodies from said surface to be treated by alternately cutting off and restoring power to an infrared radiation source in response to a representation of the temperature of the surface to be treated so as to maintain the temperature of the surface within a predetermined difference from a temperature setting
    wherein the transport support is first subjected to a primary vacuum, the subatmospheric pressure remaining greater than the pressure of the triple point of the diagram of the phases of the foreign bodies to be removed, and then the transport support is subjected to a secondary vacuum having a pressure lower than 0.1 mbar;
    wherein alternately cutting off and restoring power to the intermittent infrared radiation source includes a continuous initial stage of setting the surface to be treated to a temperature which does not degrade the transport support; and
    wherein the treatment method includes a conditioning stage, during which the surface to be treated is subjected to a progressive rise in gaseous pressure to around the atmospheric pressure, and to a drop in temperature to around the ambient temperature with injection of a clean gas flow, free from foreign bodies to be removed.

2. A method according to claim 1, wherein the infrared radiation presents an emission spectrum with maximum intensities of around the absorption wavelength(s) of the foreign body or bodies to be removed.

3. A method according to claim 1, wherein a test temperature is measured which is representative of the temperature of the surface to be treated, and the intermittent infrared radiation source is controlled in accordance with said test temperature so as to maintain said temperature of the surface to be treated at around the temperature setting.

4. The method according to claim 3 wherein the power of the infrared radiation is controlled to maintain the temperature without modifying the wavelength of the infrared radiation.

5. A method according to claim 1, wherein said subatmospheric gaseous pressure is measured and compared with a pressure setting to control, depending on the comparison, means of adjusting the pressure to bring the subatmospheric gaseous pressure to around the pressure setting and maintain it at that level.

6. A method according to claim 1, wherein a parameter representative of the removal of the foreign bodies from the surface to be treated is measured, and the treatment is interrupted when the representative parameter reaches a reference.

7. A treatment station for transport supports for the conveyance and storage of substrates, including:
    a sealed chamber intended to be connected to pumping devices and suitable for receiving at least one transport support with a surface to be treated;
    at least one source of infrared radiation, suitable for subjecting said surface to be treated to intermittent infrared radiation; and
    control devices suitable for controlling the pumping devices and the source of infrared radiation for subjecting said surface to be treated to the combined action of a subatmospheric gaseous pressure and the intermittent infrared radiation, wherein said surface to be treated is subjected to a primary vacuum, the subatmospheric pressure remaining greater than the pressure of the triple point of the diagram of the phases of the foreign bodies to be removed, and then to a secondary vacuum having a pressure lower than 0.1 mbar;
    wherein the power supply of the infrared radiation source is alternately cut off and restored to the intermittent infrared radiation source in response to a representation of the temperature of the surface to be treated so as to maintain the temperature of the surface within a predetermined difference from a temperature setting, including a continuous initial stage of setting the surface to be treated to a temperature which does not degrade the transport support; and
    wherein the surface to be treated is subjected to a progressive rise in gaseous pressure to around the atmospheric pressure, and to a drop in temperature to around the ambient temperature with injection of a clean gas flow, free from foreign bodies to be removed.

8. A treatment station according to claim 7, containing at least one temperature sensor, placed in the sealed chamber, and suitable for measuring a test temperature representative of the temperature of the surface to be treated.

9. A treatment station according to claim 8, wherein the temperature sensor contains a test layer, made of a material with the same composition as the transport supports to be treated, of a low thickness, one face of which is subjected to said intermittent infrared radiation, and the opposite face of which is in contact with a temperature probe.

10. A treatment station according to claim 8, wherein the control devices include an infrared control program, which examines the temperature data produced by the temperature sensor, which triggers the power supply of the intermittent infrared radiation source when the temperature measured by the temperature sensor is lower by more than a pre-determined difference than a temperature setting, itself lower than a maximum permissible temperature threshold, and which interrupts the power supply of the intermittent infrared radiation source whenever the temperature measured by the temperature sensor exceeds said temperature setting by more than a pre-determined difference.

11. A treatment station according to claim 7, wherein that the intermittent infrared radiation source contains at least one source part suitable for inserting inside a transport support in the form of a box.

12. A treatment station according to claim 7, including initial gas injection devices to inject a first localized gaseous flow in the vicinity of the surface to be treated.

13. A treatment station according to claim 7, including second gas injection devices to inject a clean gas flow into the sealed chamber separate from the surface to be treated.

14. A treatment station according to claim 7, containing means of measuring a parameter representative of the removal of foreign bodies from the surface to be treated, and in that the control devices are suitable for interrupting the treatment when the representative parameter reaches a reference value.

15. A treatment station according to claim 14, wherein the means of measuring for a representative parameter include:
   a scale suitable for measuring the weight of a transport support and producing a weight signal, and means of processing the weight signal to deduce from said weight signal the end of the treatment stage,
   and/or a humidity and/or contaminant sensor at the outlet of the vacuum pump of the pumping devices,
   and/or pressure gauges for the sealed chamber.

16. A treatment station according to claim 7, including washing devices used to wash the transport supports directly in the sealed chamber itself.

17. A treatment station according to claim 10, wherein the power supply of the at least one source of infrared radiation is controlled to raise and lower the temperature without modifying the wavelength of the infrared radiation.

18. A treatment station for hollow box-type transport supports for the conveyance and storage of substrates, including:
   a sealed chamber intended to be connected to pumping devices and suitable for receiving at least one transport support with a surface to be treated;
   at least one source of infrared radiation, suitable for subjecting said surface to be treated to intermittent infrared radiation by insertion inside the hollow box-type transport support; and
   control devices suitable for controlling the pumping devices and the source of infrared radiation for subjecting said surface to be treated to the combined action of a subatmospheric gaseous pressure and the intermittent infrared radiation, wherein said surface to be treated is subjected to a primary vacuum, the subatmospheric pressure remaining greater than the pressure of the triple point of the diagram of the phases of the foreign bodies to be removed, and then to a secondary vacuum having a pressure lower than 0.1 mbar;
   wherein the power supply of the infrared radiation source is alternately cut off and restored to the intermittent infrared radiation source in response to a representation of the temperature of the surface to be treated so as to maintain the temperature of the surface within a predetermined difference from a temperature setting, including a continuous initial stage of setting the surface to be treated to a temperature which does not degrade the transport support; and
   wherein the surface to be treated is subjected to a progressive rise in gaseous pressure to around the atmospheric pressure, and to a drop in temperature to around the ambient temperature with injection of a clean gas flow, free from foreign bodies to be removed.

* * * * *